United States Patent [19]

Rostami et al.

[11] Patent Number: 5,825,913
[45] Date of Patent: Oct. 20, 1998

[54] SYSTEM FOR FINDING THE ORIENTATION OF A WAFER

[75] Inventors: Fariborz Rostami, Menlo Park; James Harald Clark, Woodside, both of Calif.; David J. Michael, Newton; David J. Wilson, West Medford, both of Mass.

[73] Assignee: Cognex Corporation, Natick, Mass.

[21] Appl. No.: 503,574

[22] Filed: Jul. 18, 1995

[51] Int. Cl.[6] .................................................. G06K 9/36
[52] U.S. Cl. ...................... 382/151; 382/276; 382/288; 348/87
[58] Field of Search ................................. 382/141, 145, 382/151, 203, 204, 209, 212, 216, 217, 276, 281, 283, 287, 288, 291; 348/87, 126, 129, 130, 135; 358/453, 464; 364/474.01, 474.28, 474.29, 474.34–474.36, 470, 491, 520; 437/8; 250/202, 307, 557

[56] References Cited

U.S. PATENT DOCUMENTS

| | | | |
|---|---|---|---|
| 4,803,735 | 2/1989 | Nishida et al. | 382/151 |
| 5,048,094 | 9/1991 | Aoyama et al. | 382/151 |
| 5,371,690 | 12/1994 | Engel et al. | 382/141 |
| 5,381,004 | 1/1995 | Uritsky et al. | 250/307 |
| 5,497,007 | 3/1996 | Uritsky et al. | 250/491.1 |
| 5,585,917 | 12/1996 | Woite et al. | 382/142 |

*Primary Examiner*—Christopher S. Kelley
*Attorney, Agent, or Firm*—Russ Weinzimmer

[57] ABSTRACT

The invention can be used to find the orientation of a semiconductor wafer without wafer handling, i.e., in a non-contact manner. The invention uses knowledge of the position of a semiconductor wafer, and the position of an orientation feature of the wafer, to find the orientation of the wafer. According to the invention, a curved band image is formed that includes an image of an orientation feature. The curved band image is then transformed into a straight band image. The longitudinal position of the orientation feature is then determined in the coordinate system of the straight band image, which longitudinal position is then converted into an angular displacement in the coordinate system of the curved band image to provide the orientation of the wafer.

31 Claims, 7 Drawing Sheets

PRIOR ART

SYSTEM FOR FINDING THE ORIENTATION OF A WAFER

FIELD OF THE INVENTION

This invention relates to semiconductor manufacturing, and particularly to semiconductor wafer handling.

BACKGROUND OF THE INVENTION

Currently, on most wafer processing machines, the position and orientation of the semiconductor wafer must be determined. This is commonly performed using a mechanical and/or electro-optical device. Using this approach, a wafer is first placed on a spindle, and is then rotated by the spindle. While the wafer is being rotated, the perimeter of the wafer passes through the light beam of an electro-optical sensor assembly. At each angular position of the wafer, the radial position of the perimeter is measured and stored. After enough angular positions have been measured to cover a complete revolution, the offset of the center of the wafer with respect to the spindle axis is then calculated. Then, the wafer is lifted, moved to, and lowered onto the spindle to bring it into concentric relationship with the spindle axis.

After the wafer handling system aligns the center of the wafer with the spindle axis, the wafer is rotated on the spindle to detect the wafer flat or notch, so as to determine the orientation of the wafer. Typically, more than one rotation of the wafer is required to ensure a sufficiently accurate measurement of the angular orientation of the wafer.

This mechanical approach takes approximately between two and four seconds to find the position of the wafer center, and then to find the angular orientation of the wafer. An additional two seconds are also required initially for loading the wafer into, and finally for removing it from, the wafer handler.

Handling of wafers is a major concern in semiconductor fabrication clean rooms because wafer yield goes down as the amount of wafer handling increases. This is because each time a wafer is handled, particles are introduced into the environment that adversely affect the ultimate yield of viable integrated circuits produced from the wafer. Thus, a method of determining at least the orientation of the wafer without handling it could favorably improve yield. Moreover, a fraction of a percent improvement in yield can represent significant economic benefit to a semiconductor manufacturer.

Further, equipment such as a flat-finder station occupies significant space in a clean room. Since the operational cost of space in a clean room can be very expensive, any way to reduce or eliminate the space required to perform the wafer orientation function in a wafer fabrication facility would provide a significant economic advantage.

In addition, physical orientation features such as notches and flats created by grinding or lapping the wafer introduce crystallographic imperfections that reduce the yield of viable dies that can be fabricated on each wafer. For the coming generation of notchless, flatless, fiducial-based wafers, such as 300 mm wafers, new alignment techniques that do not require a wafer flat or a wafer notch are needed.

SUMMARY OF THE INVENTION

The invention uses knowledge of the position of a semiconductor wafer, and the position of an orientation feature of the wafer, to find the orientation of the wafer. According to the invention, a curved band image is formed that includes an image of an orientation feature. The curved band image is then transformed into a straight band image. The longitudinal position of the orientation feature is then determined in the coordinate system of the straight band image, which longitudinal position is then converted into an angular displacement in the coordinate system of the curved band image to provide the orientation of the wafer.

In a preferred embodiment of the invention, perimeter points are used in conjunction with knowledge of the diameter of the wafer to find the position of the center point of the wafer. In a preferred embodiment of the invention, the perimeter points are found using an edge detector, such as a caliper vision tool.

In a preferred embodiment, the distance of each perimeter edge point from a circle of fixed diameter based on the diameter of the wafer is minimized by finding a "best fit" location for the circle, thereby providing the position of the center point of the wafer. The center point of the wafer is used to form the curved band image of the orientation feature, such as a wafer notch or wafer flat.

To find the best fit location, the invention provides an iterative approach that discards edge points that are greater than a threshold distance from the circle. The circle is repositioned so as to be simultaneously closest to all of the remaining edge points. In an alternate embodiment, both the circle diameter and center point location can be found using a "best fit" approach.

The apparatus and method of the invention can be used to find the orientation of a semiconductor wafer without wafer handling, i.e., in a non-contact manner. The invention can be used to find the orientation of a wafer using wafer orientation features, such a wafer notches, and wafer flats, but is not limited to these physical orientation features. The invention can also accurately find the orientation of the wafer using fiducial marks on the surface of the wafer, regardless of where the fiducial mark is on the surface of the wafer.

The orientation of the wafer can be found while the wafer is in translational motion due to, for example, a robot arm, using strobe lighting. Although desirable, it is not necessary to obtain an image of the entire wafer. The wafer can be viewed from the top or the bottom in the case of notches and flats. Also, the wafer can be viewed from directions that are oblique with respect to the direction perpendicular to the wafer surface, although viewing the wafer along an axis that is perpendicular to the wafer surface is preferred.

BRIEF DESCRIPTION OF THE DRAWINGS

The invention will be more fully understood from the following detailed description, in conjunction with the accompanying figures, wherein.

DETAILED DESCRIPTION OF THE PREFERRED EMBODIMENTS

Figure 1:
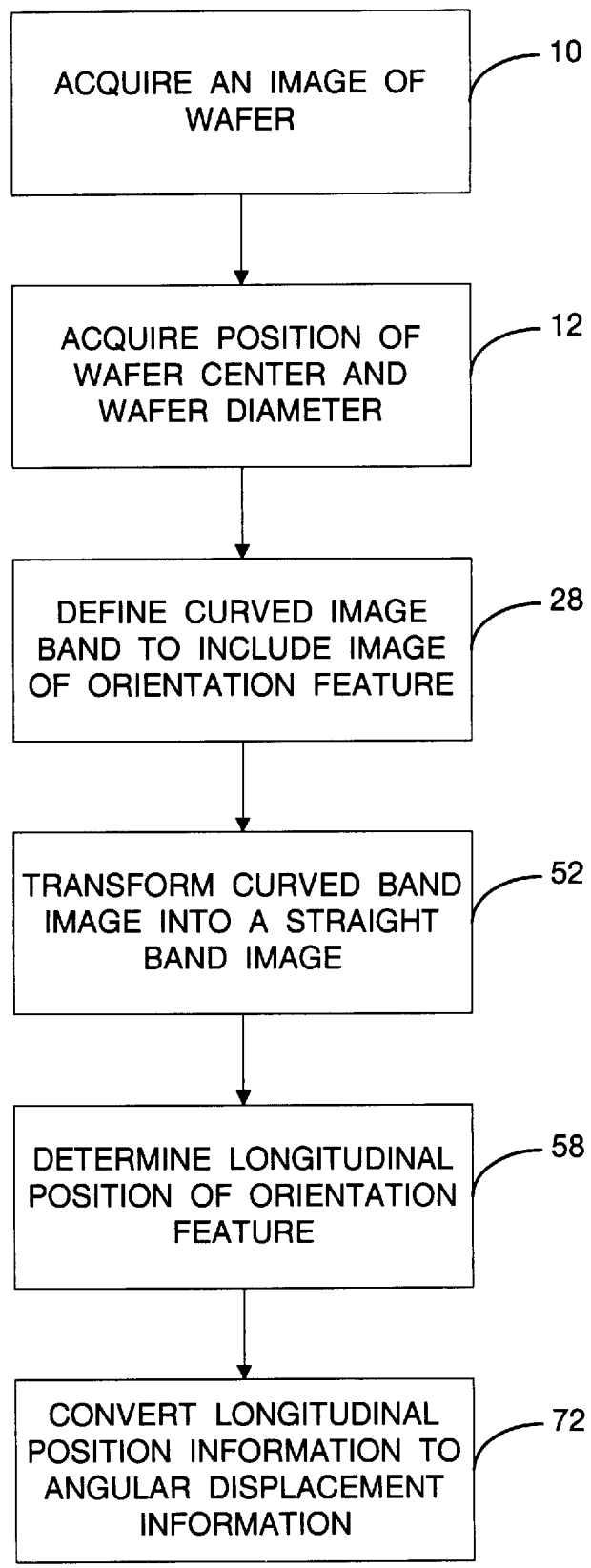
FIG. 1 is a flow chart of the steps of the method of the invention, or a block diagram of the elements of the apparatus of the invention.

Referring to FIG. 1, to determine the orientation of a wafer, such as a semiconductor wafer, an image of the wafer must be acquired (10). (Method steps are indicated by reference numbers in parentheses.) (Note that FIG. 1 can be viewed as a sequence of method steps, or as an apparatus with a plurality of apparatus elements, where information flows from each element in accordance with the arrows emerging therefrom.) The image can be acquired using a standard CCD camera. Alternatively, a laser cooperative with an array of photodetectors can be used. In the case of wafers having a wafer notch or a wafer flat as an orientation feature, a shadow of the wafer can be imaged using, for example, a CCD camera. The wafer can be illuminated with a strobe light to capture an image while the wafer is in motion, perhaps as it is carried a robot arm.

Figure 2:
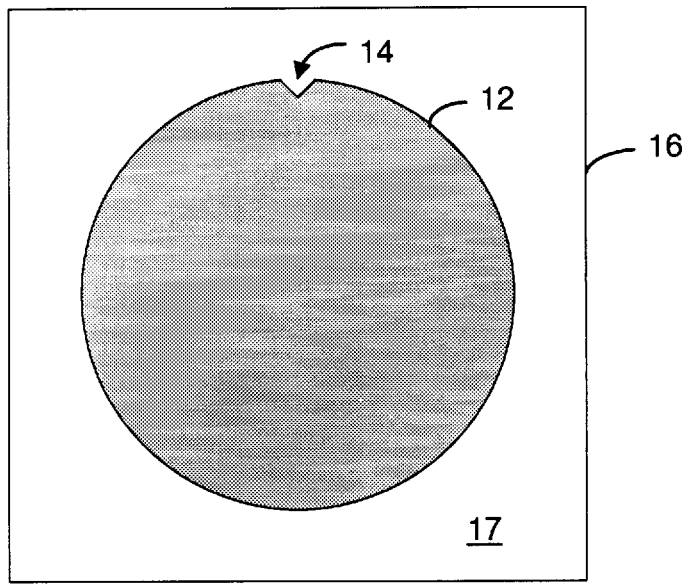
FIG. 2 is a plan view of a wafer having a notch.

FIG. 2 shows a plan view of a wafer 12 having a notch 14 that serves as an orientation feature. The wafer 12 is shown in a field of view that is bounded by a window 16. The polarity of the image of the wafer is not important, i.e., the invention can use an image of a wafer that is light with a dark background as well as it can use an image of a wafer that is dark with a light background 17, as shown in FIGS. 2 and 3.

Figure 3:
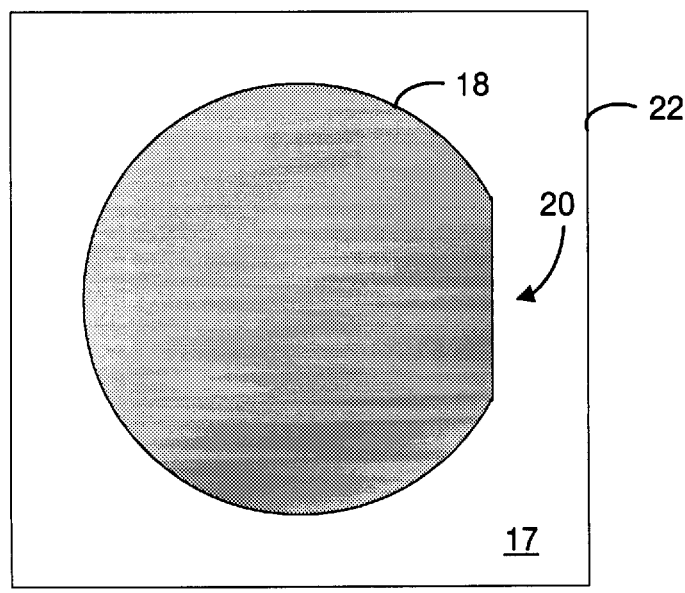
FIG. 3 is a plan view of a wafer having a flat.

FIG. 3 shows a plan view of a wafer 18 having a flat 20 that serves as an orientation feature. The wafer 18 is shown in a field of view that is bounded by a window 22. Again, the polarity of the image of the wafer is not important. Note that the total area of the notch 14 is significantly less than the area of the wafer flat 20, which makes it more difficult to find for area-based search techniques, such as normalized correlation search.

Next, the position of the center of the wafer and the wafer diameter are acquired (12). Information regarding both the position of the center of the wafer and the wafer diameter can be acquired without using machine vision.

For example, the wafer diameter is generally known by the operator of the wafer handler for the fabrication process being performed. Alternatively, the wafer diameter can be measured mechanically, and the result of the measurement can be provided to the functionality that defines the curved image band, such as the polar-to-cartesian image transformer, to be discussed in more detail below.

Likewise, the position of the center of the wafer can be obtained mechanically, for example, from position sensors of the wafer handler. The result can then be provided to the functionality that defines the curved image band.

Figure 4:
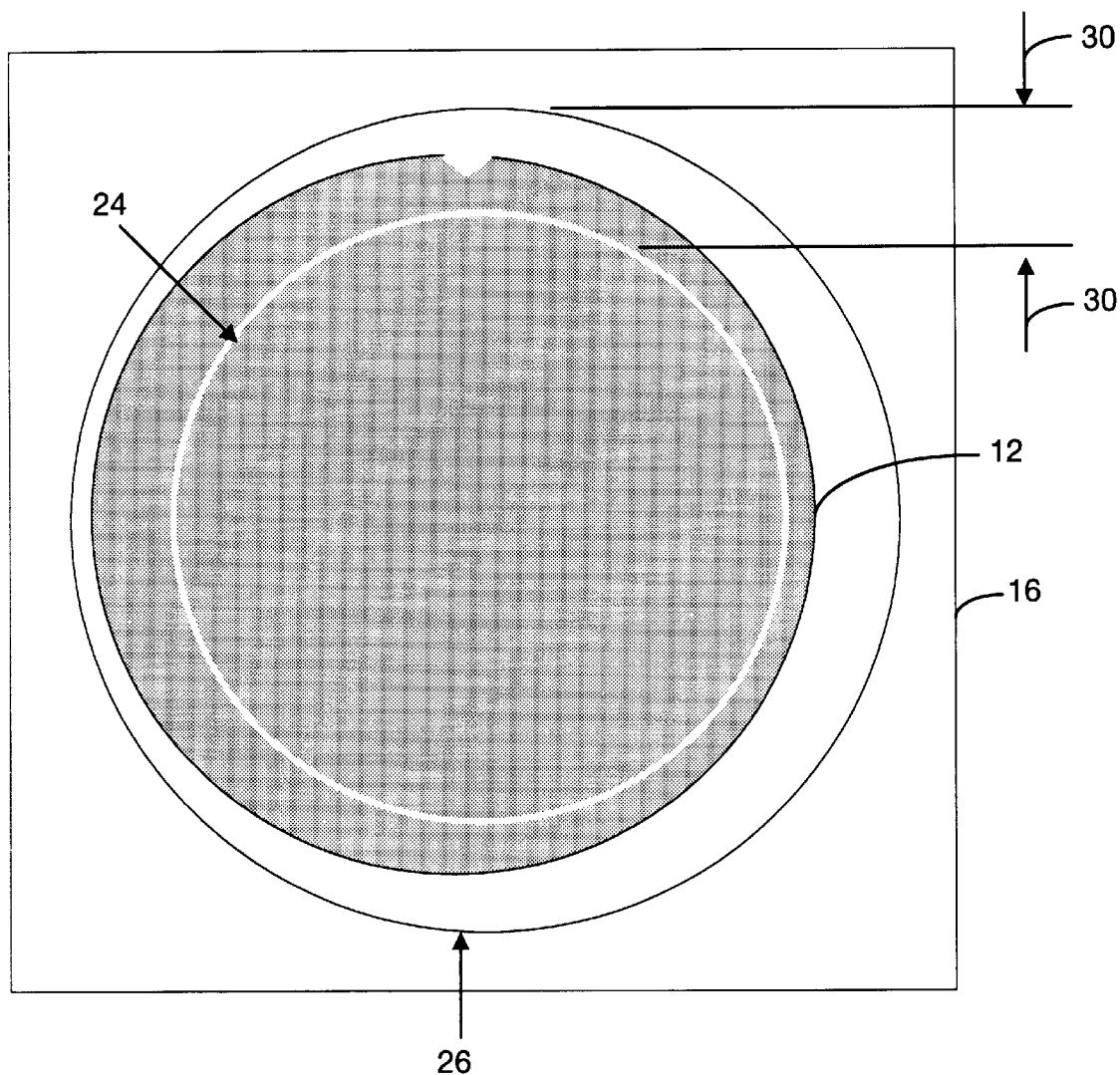
FIG. 4 is a plan view of a wafer having a notch whose position is known approximately.

With reference to FIG. 4, if the position of the wafer 12 is known approximately, with a known positional uncertainty, then the image of the wafer 12 can be placed inside of the image window 16, and a curved image band having an inner boundary 24 and an outer boundary 26 can be defined (28) that has a width 30 that is equal or proportional to the positional uncertainty. In this way, regardless of the actual placement of the wafer 12 within the image window 16, the entire wafer will fall within the outer boundary 26, and contain the inner boundary 24, so as to enclose the entire edge of the wafer 12.

The width 30 of the curved image band can be wider than the positional uncertainty, but the added number of pixels to consider will slow down the analysis of the image band. Likewise, the method and apparatus of the invention will still work, even when the entire edge is not included within the curved image band, with some degradation in accuracy and/or speed, which may be acceptable, or even desirable, in some applications.

Figure 5:
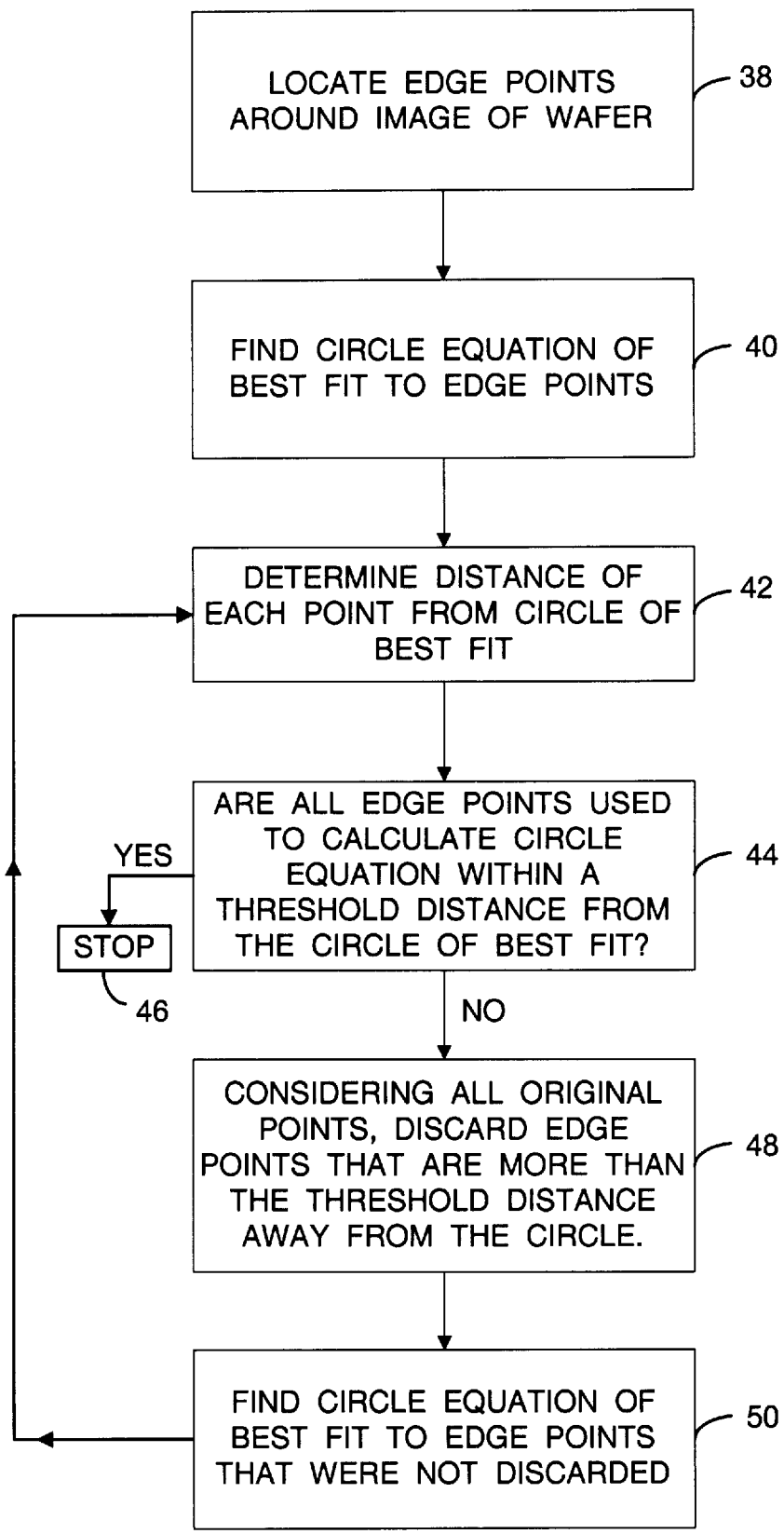
FIG. 5 is a flow chart of the steps of a preferred method to obtain further accuracy, or a block diagram of the apparatus elements of a preferred embodiment to obtain more accuracy.

In a preferred embodiment, after the image band has been defined, further accuracy in the position of the wafer can be obtained by performing the steps set forth in FIG. 5.

Figure 6:
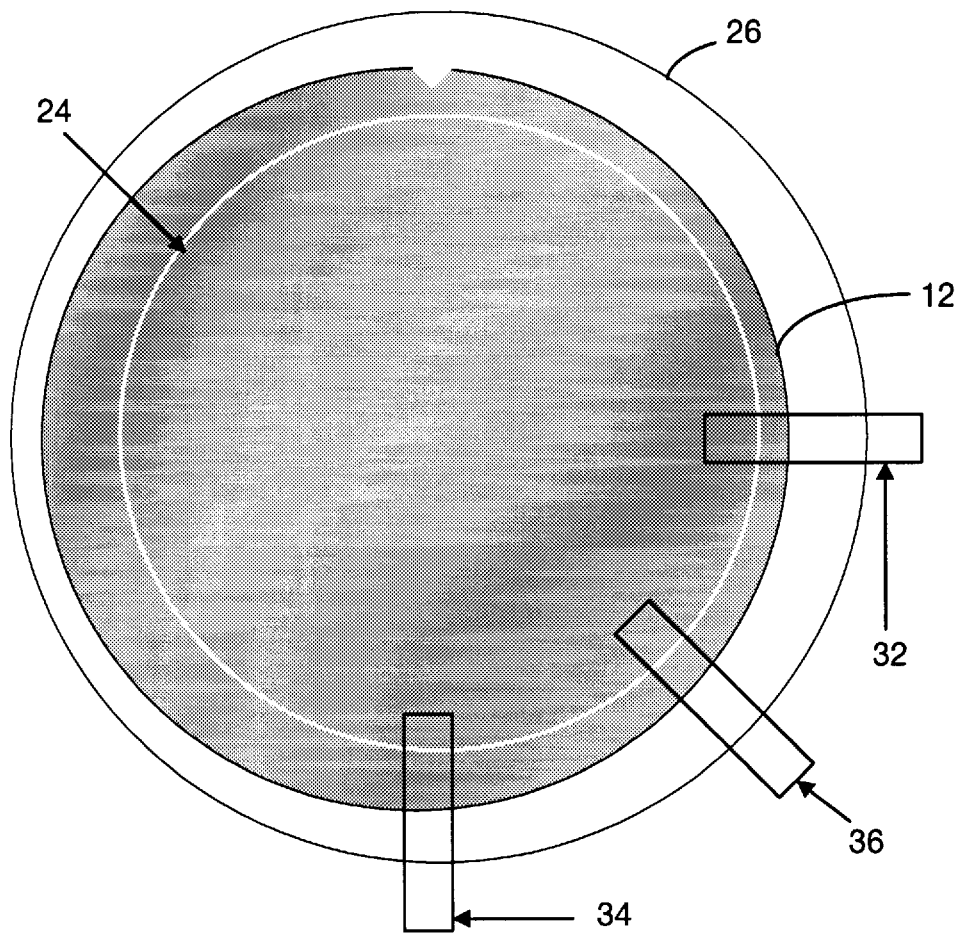
FIG. 6 is a plan view of a wafer whose position is being determined more accurately.

Referring to FIGS. 5 and 6, at least three edge detection windows 32, 34, 36 are created to determine the location (38) of at least three respective edge points of the image of the wafer 12. A portion of the edge of the wafer lies within each window 32, 34, 36. The position of the edge can be found using any edge-finding technique, such as application of a Sobel operator, or any other edge detection operator. A preferred technique is to apply a CALIPER vision tool, sold by Cognex Corporation, and described in the Vision Tools manual, Rev. 6.0, on pages 5–1 through page 5–32, herein incorporated by reference, and also available from Cognex Corporation, Natick MA.

The more edge detection windows that are used, the more edge points will be available for subsequent calculation of the position of the centerpoint, making the calculation more accurate, but also increasing the time needed to perform the calculation. In a preferred embodiment, one hundred edge detection windows are used, providing one hundred edge points. It is also preferable to space the edge detection windows evenly around the wafer, regardless of the number of edge detection windows used.

Next, the edge points found by the edge detection windows 32, 34, 36 are provided to a functionality that finds the circle equation of best fit to the edge points (40).

It can be advantageous to provide only those edge points that correspond to the circular edge of the wafer, and not provide (filter) edge points that correspond to the wafer flat or notch, or other physical orientation feature. One method for providing only edge points of the circular portion of the wafer is to use the Hough transform, as is known by those skilled in the art.

It is especially advantageous, and necessary for some applications to perform filtering of edge points based on the shape from which the edge point originates when the method for finding the circle equation of best fit to the edge points of the wafer has three degrees of freedom, i.e., the x-coordinate of the center point of the circle, the y-coordinate of the center point of the circle, and the radius of the circle. An example of this method for finding a best fit circle is described in "Computer Vision for Electronics Manufacturing" by L. F. Pau, page 227, published by Plenum Press, New York, 1990. Without some filtering of the "structured noise" introduced by the edge points of the wafer flat or notch, convergence of best-fit circle finding functionality with three degrees of freedom can be slow and may not happen at all.

In a preferred embodiment, it is not necessary to perform any filtering of "structured noise" when the diameter of the wafer is known, and therefore the degrees of freedom of the equation of the circle equation of best fit can be reduced to two: the x-coordinate of the center point of the circle, the y-coordinate of the center point of the circle.

So, given a set of points that lie on a circle, such as the points found by a plurality of edge detection windows, how can the center of the circle be found, given that the radius of the circle is known in advance?

One way is to try to fit a circle (in the least-squares sense) to those points. The idea is to mathematically find the center point of a circle such that square of the mathematical error of the points on the circle is smallest. To maximize robustness, all of the points on the circle are used simultaneously. Some points could be weighted more then others if we believe that those points are more reliable, but typically all of the points are weighted equally. The matrix equation could be re-solved incrementally as each circle point (after the third point) is obtained, but typically the equation is solved only after all the points are accumulated. The set of at least three points is represented by at least three sets of coordinates $(x_i, y_i)$ The number of points on that circle is N. The radius of the circle is known in advance and is denoted by r.
Each point contributes to eight different mathematical sums. The first step is accumulating these eight sums.
Sum a is $-2$ times $x_i$.
Sum b is 4 times $x_i$ times $x_i$.
Sum c is 4 times $x_i$ times $y_i$.
Sum d is $-2$ times $y_i$.
Sum e is 4 times $y_i$ times $y_i$.
Sum f is $-2$ times $x_i$ times the expression r times r minus $x_i$ times $x_i$ minus $y_i$ times $y_i$.
Sum g is the expression r times r minus $x_i$ times $x_i$ minus $y_i$ times $y_i$.
Sum h is $-2$ times $y_i$ times the expression r times r minus xi times xi minus yi times yi.

The sums are part of a 3 by 3 matrix A and a 1 by 3 vector b. The first row of the matrix A is sum a, sum b, and sum c. The second row of the matrix is the number of points N, sum a, and sum d. The third row of the matrix is sum d, sum c, and sum e. The elements of the vector b is the sum f, sum g, and sum h.

The second step is solving the matrix equation whose elements consist of the sums. Using standard techniques from linear algebra such as matrix inversion or elimination, the 3×3 linear system of equations A x=b can be solved for the 1 by 3 vector x whose second and third elements are the center of the circle's x coordinate and the center of the circle's y coordinate. Mathematically, the equation can be written as follows where $(x_c, y_c)$ is coordinate of the circle center:

$$\begin{bmatrix} -2\Sigma x_i & 4\Sigma x_i^2 & 4\Sigma x_i y_i \\ N & -2\Sigma x_i & -2\Sigma y_i \\ -2\Sigma y_i & 4\Sigma x_i y_i & 4\Sigma y_i^2 \end{bmatrix} \begin{bmatrix} x_c^2 + y_c^2 \\ x_c \\ y_c \end{bmatrix} = \begin{bmatrix} \Sigma(-2x_i)(r^2 - x_i^2 - y_i^2) \\ \Sigma(r^2 - x_i^2 - y_i^2) \\ \Sigma(-2y_i)(r^2 - x_i^2 - y_i^2) \end{bmatrix} \quad \text{EQ. 1}$$

Next, after an equation of the circle of best fit to the original set of edge points is found as in step (40), the distance of each edge point from the circle of best fit is determined (42). Next, each of the distances is compared to a threshold distance from the circle of best fit (44). The threshold distance is proportional to the standard deviation of the distances of the points that were used to calculate the circle of best fit. If the distances of all of the edge points that were used to calculate the equation of the circle of best fit fall within the threshold distance, then the equation of the circle is returned (46), and therefore the position of the center of the circle of best fit is known. Consequently, the position of the wafer center is known to a high degree of accuracy. For example, accuracy to within ¹⁄₁₀₀ of a pixel has been achieved with this method, where an 8" image window or field of view measures 500 pixels across.

If the distances of all of the edge points that were used to calculate the equation of the circle of best fit do not fall within the threshold distance, then considering all of the original edge points (not just the edge points used to compute the equation of the circle of best fit), the edge points that are more than the threshold distance away from the circle of best fit are discarded (48), and then the equation of another circle of best fit is calculated (50). The next step is to again determine the distance from the circle of best fit of each edge point that was used to calculate the corresponding circle equation (42).

Returning to FIG. 4, the image contained within the two concentric bounding rings 24 and 26 is called a curved or circular band image. According to the invention, this curved band image is transformed into a straight band image (52), as shown in FIG. 7.

Figure 7:
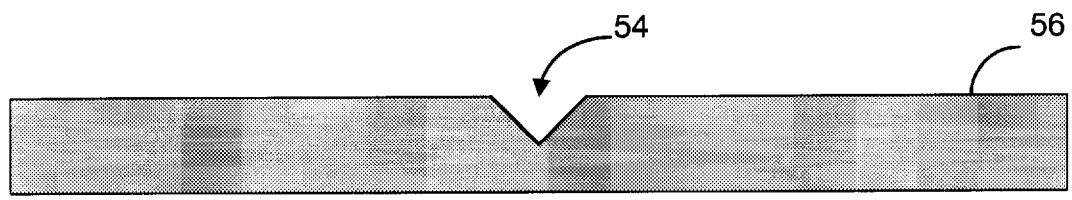
FIG. 7 is a straight band image of the curved band image of FIG. 4.

FIG. 7 shows a straight band image of the notch 54, and the edge 56 of the wafer 12. Note that the edge is of uniform thickness along its length, indicating that the wafer was well centered within the circular image band of FIG. 4.

Next, the longitudinal position of the notch 54 is determined (60). In general, any feature-finding functionality can be used to find the location of the notch in the cartesian coordinate system of the straight band image. Examples of such functionality include template matching, such as Hough Transform template matching, blob analysis, or normalized correlation search.

In a preferred embodiment of the invention, a projection is performed along a direction perpendicular to the longitudinal direction of the straight band image in FIG. 7. The result is shown in FIG. 7A, wherein a projection peak is computed by adding all of the pixels along each column of the image in FIG. 7, where brighter pixels have a higher value than the darker pixels.

Figure 7A:
FIG. 7A is a trace of a projection in a direction perpendicular to the longitudinal direction of FIG. 7.
Figure 7B:
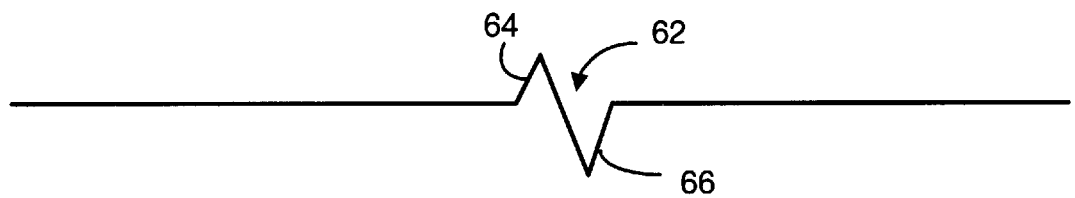
FIG. 7B is a trace of the first difference of FIG. 7A.

Next, to obtain the trace in FIG. 7B, the first difference of the trace in FIG. 7A is performed, so as to obtain a first difference feature 62 with a first peak 64 and a second peak 66. In a preferred embodiment, an edge detector, such as the CALIPER tool, sold by Cognex Corporation, is used to find the position of each of the peaks 64 and 66. The longitudinal position of the notch 54 is then found by finding the position of the midpoint between the peaks 64 and 66.

Figure 8:
FIG. 8 is a straight band image of the curved band image of FIG. 3.
Figure 8A:
FIG. 8A is a trace of the orthogonal projection of FIG. 8.
Figure 8B:
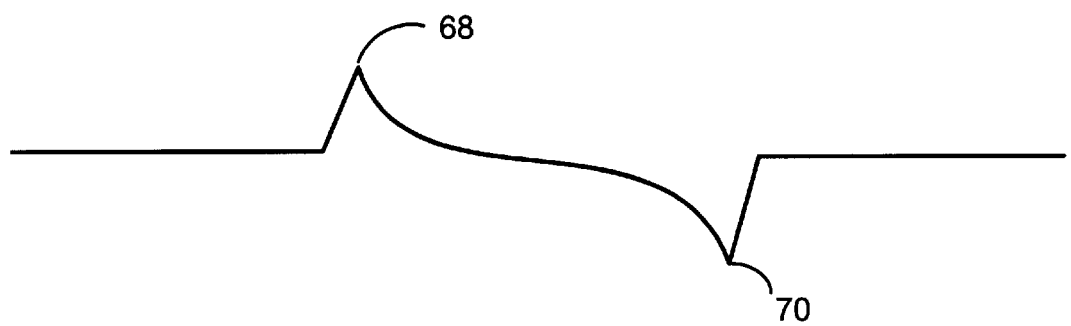
FIG. 8B is a trace of the first difference of FIG. 8A.

In an analogous way, the longitudinal position of a wafer flat can be found by creating a straight band image of the wafer flat, as shown in FIG. 8. Then, as in the case of the wafer notch explained above, an orthogonal projection is performed to obtain the trace in FIG. 8A. Lastly, the first difference of the trace in FIG. 8A is performed to obtain the trace in FIG. 8B. As before, the CALIPER tool can be used to find the longitudinal position of the two peaks 68 and 70, from which can be calculated the longitudinal position of the water flat.

Next, the longitudinal position of the orientation feature, i.e., the notch or flat, for example, is converted to the angular displacement in the coordinate system of the curved band, such as a polar coordinate system. This is done using a ratio of angular displacement per longitudinal image pixel, such as 0.25 degrees per pixel. Thus, by knowing the longitudinal position, the angular displacement can be calculated.

There are wafers that have two flats. In this case, the orientation of both flats can be measured and reported using the invention.

It is important to note that the curved band image should preferably cover more than 360 degrees of the wafer. The extent of the coverage beyond 360 degrees is set by the width of the largest notch, flat, or other orientation feature. This ensures that if the orientation feature falls at the border of the curved image band, a full orientation feature will be present in the straight band image.

It should be noted that if the camera is not aimed at the wafer along an axis that is perpendicular to the surface, an elliptical image of the wafer will result. In this case, the simplest approach is to transform the image so the wafer appears circular, and then process the image according to the invention as described above.

Other modifications and implementations will occur to those skilled in the art without departing from the spirit and the scope of the invention as claimed. Accordingly, the above description is not intended to limit the invention except as indicated in the following claims.

What is claimed is:

1. Apparatus for determining the orientation of a semiconductor wafer having an orientation feature, a center point, a perimeter, and a principal radius extending from the center point to the perimeter, the apparatus comprising:

means for acquiring an image of at least a portion of said wafer including an image of at least a portion of said orientation feature;

means for acquiring knowledge of the position of said center point, and of the radial distance of a point on said orientation feature from said center point;

means for using said knowledge to define a curved image-partitioning band having a curved inner boundary, a curved outer boundary, and a curved angular displacement scale, such that said image of at least a portion of said orientation feature is disposed between said inner and outer boundaries to provide a curved band image;

polar-to-cartesian coordinate conversion means for transforming said curved band into a straight band image including a longitudinal position scale;

means for determining knowledge of the longitudinal position along said longitudinal position scale of said image of at least a portion of said orientation feature; and means for converting said knowledge of said longitudinal position into knowledge of the corresponding angular displacement along said curved angular displacement scale, so as to provide knowledge of the orientation of said semiconductor wafer.

2. The apparatus of claim 1, wherein said image of at least a portion of said wafer includes at least a portion of said perimeter, said apparatus further comprising:

means for acquiring knowledge of the position of a plurality of points along at least said portion of said perimeter;

means for determining a curve of best fit to said plurality of points; and means for determining a focal point of said curve of best fit.

3. The apparatus of claim 2, wherein said curve of best fit is a circle, and said focal point of said curve of best fit is the center point of said circle, said apparatus further comprising:

means for determining a radius of said circle.

4. The apparatus of claim 1, wherein said curved inner boundary includes an arc of a circle of a first radius, said curved outer boundary includes an arc of a circle of a second radius that is of greater length than said first radius, and said curved angular displacement scale is a polar coordinate system.

5. The apparatus of claim 1 wherein said means for acquiring an image includes a CCD camera.

6. The apparatus of claim 1, wherein said means for acquiring an image includes a laser cooperative with at least one photodetector.

7. The apparatus of claim 1 wherein said means for acquiring knowledge of the position of said center point includes a wafer handler.

8. The apparatus of claim 1 wherein said means for acquiring knowledge of the position of said center point uses said image of at least a portion of said wafer.

9. The apparatus of claim 1 wherein at least a portion of said perimeter of said semiconductor wafer is disposed between said inner and outer boundaries.

10. The apparatus of claim 1, wherein said orientation feature includes a wafer notch.

11. The apparatus of claim 1, wherein said orientation feature includes a wafer flat.

12. The apparatus of claim 1, wherein said orientation feature includes a fiducial mark.

13. The apparatus of claim 1 wherein said means for determining knowledge of the longitudinal position along said longitudinal position scale includes an edge detector.

14. The apparatus of claim 13, wherein said edge detector is a caliper vision tool.

15. The apparatus of claim 1 wherein said means for determining knowledge of the longitudinal position along said longitudinal position scale includes a feature finder.

16. The apparatus of claim 15, wherein said feature finder includes means for template matching.

17. The apparatus of claim 16, wherein said feature finder includes means for General Hough Transform template matching.

18. The apparatus of claim 15, wherein said feature finder includes means for normalized correlation search.

19. The apparatus of claim 15, wherein said feature finder includes means for blob analysis.

20. The apparatus of claim 2, wherein said means for acquiring knowledge of the position of a plurality of points along at least said portion of said perimeter includes an edge detector.

21. The apparatus of claim 20, where said edge detector includes a caliper vision tool.

22. The apparatus of claim 1 wherein said means for acquiring an image of at least a portion of said wafer includes means for acquiring an image of said wafer along an axis that is perpendicular to a surface of said wafer.

23. The apparatus of claim 1 wherein said means for acquiring an image of at least a portion of said wafer includes means for transforming an image acquired along an axis that is not perpendicular to a surface of said semiconductor wafer into an image that is substantially equivalent to an image acquired along an axis that is perpendicular to said surface.

24. Apparatus for determining the orientation of a semiconductor wafer having an orientation feature, a center point, a perimeter, and a principal radius extending from the center point to the perimeter, the apparatus comprising:

means for acquiring an image of at least a portion of said wafer including an image of at least a portion of said perimeter, and at least a portion of said orientation feature;

means for acquiring knowledge of the position of said center point, and of the radial distance of a point on said perimeter from said center point;

means for using said knowledge to define an outer circular boundary in substantially concentric relationship with said perimeter, said outer circular boundary having a radius greater than a radial distance of a point on said perimeter;

means for using said knowledge to define an inner circular boundary in substantially concentric relationship with said outer circular boundary, said inner circular boundary having a radius less than said radial distance of said point on said perimeter;

means for using said knowledge to define a circular angular displacement scale;

polar-to-cartesian coordinate conversion means for transforming a circular band image that is bounded by said inner and outer boundaries; into a straight band image, said circular band image including an image of at least a portion of said perimeter, an image of at least a portion of said orientation feature, and a longitudinal position scale;

means for determining knowledge of the longitudinal position along said longitudinal position scale of said image of at least a portion of said orientation feature; and means for converting said knowledge of said longitudinal position into knowledge of the corresponding angular displacement along said curved angular displacement scale, so as to provide knowledge of the orientation of said semiconductor wafer.

25. A method for determining the orientation of a semiconductor wafer having an orientation feature, a center point, a perimeter, and a principal radius extending from the center point to the perimeter, the method comprising the steps of:

acquiring an image of at least a portion of said wafer including an image of at least a portion of said orientation feature;

acquiring knowledge of the position of said center point, and of the radical distance of a point on said orientation feature from said center point;

using said knowledge to define a curved image-partitioning band having a curved inner boundary, a curved outer boundary, and a curved angular displacement scale, such that said image of at least a portion of said orientation feature is disposed between said inner and outer boundaries to provide a curved band image;

transforming said curved band image into a straight band image, including a longitudinal position scale, using a polar-to-cartesian coordinate transform;

determining knowledge of the longitudinal position along said longitudinal position scale of said image of at least a portion of said orientation feature; and converting said knowledge of said longitudinal position into knowledge of the corresponding angular displacement along said curved angular displacement scale, so as to provide knowledge of the orientation of said semiconductor wafer.

26. The method of claim 25, wherein said image of at least a portion of said wafer includes at least a portion of said perimeter, said method further comprising the steps of:

acquiring knowledge of the position of a plurality of points along at least said portion of said perimeter;

determining a curve of best fit to said plurality of points; and determining a focal point of said curve of best fit.

27. The method of claim 25, wherein said curve of best fit is a circle, and said focal point of said curve of best fit is the center point of said circle, said method further comprising the steps of:

determining a radius of said circle.

28. The method of claim 25, wherein said curved inner boundary includes an arc of a circle of a first radius, said curved outer boundary includes an arc of a circle of a second radius that is of greater length than said first radius, and said curved angular displacement scale is a polar coordinate system.

29. The method of claim 25 wherein said step of acquiring an image of at least a portion of said wafer includes the step of acquiring an image of said wafer along an axis that is perpendicular to a surface of said wafer.

30. The method of claim 25, wherein said step of acquiring knowledge of the position of said center point, and of the radial distance of a point on said orientation feature from said center point, includes the steps of:

locating a plurality of edge points of the perimeter of the image of the wafer;

finding a circle equation of best fit to said plurality of edge points;

determining the distance of each point from said circle of best fit;

determining whether each of said plurality of edge points is within a threshold distance from said circle of best fit, and returning an equation of said circle of best fit only if each of said plurality of edge points is within said threshold distance;

considering all original edge points, discarding each edge point that is disposed more than said threshold distance from said circle of best fit; and determining a next circle of best fit using only a plurality of edge points that were not discarded.

31. The method of claim 30, wherein the step of finding a circle equation of best fit to said plurality of edge points includes the steps of:

measuring the diameter of the wafer; and using said diameter to determine said circle equation of best fit.

* * * * *